United States Patent
Lee et al.

(10) Patent No.: US 7,655,525 B2
(45) Date of Patent: Feb. 2, 2010

(54) SEMICONDUCTOR DEVICE FREE OF GATE SPACER STRESS AND METHOD OF MANUFACTURING THE SAME

(75) Inventors: Sun-jung Lee, Seoul (KR); Hong-jae Shin, Seoul (KR); Bong-seok Suh, Hwasung-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 235 days.

(21) Appl. No.: 11/848,991

(22) Filed: Aug. 31, 2007

(65) Prior Publication Data

US 2008/0079089 A1    Apr. 3, 2008

(30) Foreign Application Priority Data

Sep. 4, 2006    (KR) ............... 10-2006-0084852

(51) Int. Cl.
 *H01L 21/336*    (2006.01)
 *H01L 21/8238*   (2006.01)
 *H01L 21/4763*   (2006.01)

(52) U.S. Cl. .............. 438/300; 438/230; 438/233; 438/630

(58) Field of Classification Search .......... 438/300, 438/305, 592, 694, 683, 303, 664, 902, 230, 438/231, 233, 586, 682, 655, 630
See application file for complete search history.

(56) References Cited

U.S. PATENT DOCUMENTS

| | | | |
|---|---|---|---|
| 5,153,145 A | * | 10/1992 | Lee et al. .................. 438/305 |
| 5,744,395 A | | 4/1998 | Shue et al. |
| 6,693,013 B2 | * | 2/2004 | Bae et al. .................. 438/303 |
| 6,723,609 B2 | * | 4/2004 | Yang et al. ............... 438/303 |
| 6,724,085 B2 | * | 4/2004 | Tomita ..................... 257/758 |

(Continued)

FOREIGN PATENT DOCUMENTS

JP    62-169412    7/1987

(Continued)

OTHER PUBLICATIONS

English Abstract for Publication No.: 62-169412.

(Continued)

*Primary Examiner*—Chuong A. Luu
(74) *Attorney, Agent, or Firm*—F. Chau & Associates, LLC

(57) ABSTRACT

A semiconductor device that prevents gate spacer stress and physical and chemical damages on a silicide region, and a method of manufacturing the same, according to an exemplary embodiment of the present invention, includes a substrate, isolation regions formed in the substrate, a gate pattern formed between the isolation regions on the substrate, an L-type spacer adjacent to the sidewall of the gate pattern and extended to the surface of the substrate, source/drain silicide regions formed on the substrate between the end of the L-type spacer extended to the surface of the substrate and the isolation regions, via plugs electrically connected with the source/drain silicide regions, an interlayer dielectric layer which is adjacent to the L-type spacer and which fills the space between the via plugs layer formed on the gate pattern and the substrate, and a signal-transfer line formed on the interlayer dielectric layer.

20 Claims, 13 Drawing Sheets

U.S. PATENT DOCUMENTS

| | | | |
|---|---|---|---|
| 6,869,839 B2 * | 3/2005 | Lee et al. | 438/238 |
| 7,157,358 B2 * | 1/2007 | Hall et al. | 438/583 |
| 7,164,163 B2 * | 1/2007 | Chen et al. | 257/288 |
| 7,183,184 B2 * | 2/2007 | Doczy et al. | 438/585 |
| 7,262,992 B2 * | 8/2007 | Shibata et al. | 365/185.05 |
| 7,553,763 B2 * | 6/2009 | Hsiao et al. | 438/659 |

FOREIGN PATENT DOCUMENTS

| | | |
|---|---|---|
| JP | 2003-224135 | 8/2003 |
| KR | 1998-040671 | 8/1998 |
| KR | 1998-057002 | 9/1998 |
| KR | 1020000001081 | 1/2000 |
| KR | 1020050048125 | 5/2005 |

OTHER PUBLICATIONS

English Abstract for Publication No.: 1998-040671.
English Abstract for Publication No.: 1998-057002.
English Abstract for Publication No.: 1020000001081.
English Abstract for Publication No.: 2003-224135.
Korean Office Action.
English Abstract for Publication No.: 1020050048125.

* cited by examiner

SEMICONDUCTOR DEVICE FREE OF GATE SPACER STRESS AND METHOD OF MANUFACTURING THE SAME

CROSS REFERENCE TO RELATED FOREIGN APPLICATION

This application claims priority from Korean Patent Application No. 10-2006-0084852 filed on Sep. 4, 2006, in the Korean Intellectual Property Office, the contents of which are herein incorporated by reference in their entirety.

BACKGROUND OF THE INVENTION

1. Field of the Invention

The present disclosure is directed to a semiconductor device and method of manufacturing the same. More particularly, the present disclosure is directed to a semiconductor device free from the stress of gate spacers and physical and chemical damage on silicide regions and method of manufacturing the same.

2. Description of the Related Art

As the density of semiconductor devices increases, it has becoming increasingly difficult to use conductive polycrystalline silicon to secure enough conductivity for semiconductor devices to operate in a stable condition. As a result, conductive parts, previously composed of conductive polycrystalline silicon, such as gate electrodes, source/drain regions, contacts or via plugs, and signal transfer lines, have been gradually replaced by metallic materials. However, it is challenging to make metal patterns as compared to polycrystalline silicon. Also, because a semiconductor substrate is not metal, if metal contacts the semiconductor substrate, voids are formed in the metal. This not only makes the structure unstable, but also increases resistance such that the structure cannot be used in a semiconductor device. Therefore, the pattern is not formed of pure metal, but of silicide and metal. After the pattern is formed of silicon, a silicide layer is formed by combining a silicon pattern with metal. However, the silicide layer can be damaged where the characteristics of the silicide layer deteriorate and the shape of the silicide layer changes. Especially, the damage and the transformation of the silicide pattern of the source/drain region have an impact on the deterioration of characteristics as compared to the damage and the transformation of other parts.

Also, a gate spacer is generally formed from the transistors (or gates) of a semiconductor device. A gate spacer typically is formed of materials having a high degree of density and solidity. Due to the increasing integration of semiconductor devices and the small geometry of patterns, the stress generated by a gate spacer is becoming a concern. The volume of a semiconductor device increases or decreases in a repeated fashion as it absorbs or generates heat during manufacturing. As a result, various types of stresses are generated depending on the differences of heat expansion coefficients of elements forming the semiconductor device. These stresses deteriorate the characteristics of the source/drain and channel region of the semiconductor devices. Such stresses have been considered unimportant since they had an insignificant impact on the characteristics of a semiconductor device, but the impact of theses stresses has become more significant. Consequently, there is a need for research and development avoiding or relieving the stress caused by a gate spacer. Research has been conducted on removing the gate spacer. If the gate spacer is removed, the silicide region, which is comparatively weak, can cause trouble.

SUMMARY OF THE INVENTION

Embodiments of the present invention provide a semiconductor device which can prevent gate spacer stress, and physical and chemical damage to a silicide region.

Embodiments of the present invention also provide a method of manufacturing a semiconductor device which can prevent gate spacer stress, and physical and chemical damage to a silicide region.

Embodiments of the present invention should not be construed as being limited to the above object, and the above stated objects as well as other objects and features of embodiments of the present invention will become clear to those skilled in the art upon review of the following description.

According to an aspect of the present invention, there is provided a semiconductor device including a substrate, isolation regions formed in the substrate, a gate pattern formed between the isolation regions on the substrate, an L-type spacer adjacent to the sidewall of the gate pattern and having an end extended to the surface of the substrate, source/drain silicide regions formed on the substrate between the end of the L-type spacer extended to the surface of the substrate and the isolation regions, via plugs formed on the gate pattern and the substrate and electrically connected with the source/drain silicide regions, an interlayer dielectric layer which is adjacent to the L-type spacer and which fills the space between the via plugs layer, and a signal transfer line formed on the interlayer dielectric layer.

According to another aspect of the present invention, there is provided a method of fabricating a semiconductor device including forming isolation regions in a substrate, forming a gate pattern on the substrate, forming an L-type spacer layer which covers the upper region and the sidewall of the gate pattern, forming a gate spacer layer on the L-type spacer layer, forming an L-type spacer on the sidewall of the gate pattern and extended to the substrate and a gate spacer by patterning the L-type spacer layer and the gate spacer layer, and simultaneously exposing the surface of the substrate between the gate spacer and the isolation regions, forming a source/drain silicide region on the exposed substrate, forming a sacrificial metal layer on the source/drain silicide region, removing the gate spacer, removing the sacrificial metal layer, forming an interlayer dielectric layer which covers the gate pattern and the source/drain silicide region, and forming via plugs electrically connected with the source/drain silicide region by vertically penetrating the interlayer dielectric layer.

According to another aspect of the present invention, there is provided a method of fabricating a semiconductor device including forming isolation regions in a substrate, forming a gate pattern on the substrate, forming an L-type spacer layer which covers the upper region and the sidewall of the gate pattern, forming a gate spacer layer on the L-type spacer layer, forming an L-type spacer on the sidewall of the gate pattern and extended to the substrate and a gate spacer by patterning the L-type spacer layer and the gate spacer layer, and exposing the surface of the substrate corresponding to between the gate spacer and the isolation regions, forming a source/drain silicide region on the exposed substrate, forming a source/drain pad metal layer on the source/drain silicide region, removing the gate spacer, forming an interlayer dielectric layer which covers the gate pattern and the source/drain silicide region, and forming via plugs electrically connected with the source/drain silicide region by vertically penetrating the interlayer dielectric layer.

BRIEF DESCRIPTION OF THE DRAWINGS

The above and other features of embodiments of the present invention will become more apparent by describing in detail exemplary embodiments thereof with reference to the attached drawings.

DETAILED DESCRIPTION OF EXEMPLARY EMBODIMENTS

Figure 1A:
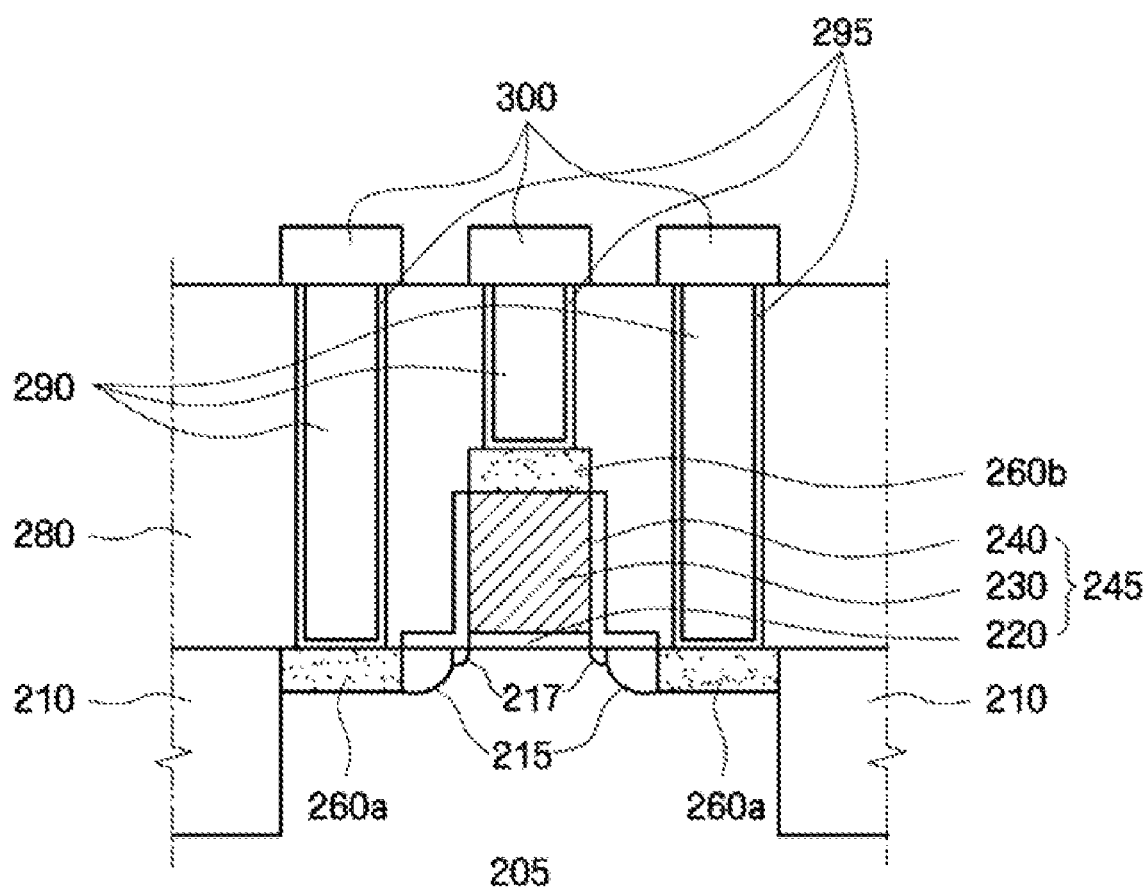
FIG. 1A through 1E are vertical views illustrating semiconductor devices according to an exemplary embodiment of the present invention.

Features of embodiments of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Hereinafter, a structure of the semiconductor device and a method of manufacturing the same will be described with reference to drawings.

FIG. 1A through 1E are vertical views illustrating semiconductor devices according to various exemplary embodiments of the present invention.

Referring to FIG. 1A, a semiconductor device according to an exemplary embodiment of the present invention includes isolation regions 210 formed on a substrate 205, a gate pattern 245 formed on the substrate 205 between the isolation regions 210, source/drain silicide regions 260a formed on the substrate 205 between the gate pattern 245 and the isolation regions 210, a gate silicide region 260b formed on the gate pattern 245, via plugs 290 electrically connected with the gate silicide region 260b and the source/drain regions 260a, an interlayer dielectric layer 280 which covers the gate pattern 245, source/drain silicide region 260a, the gate silicide region 260b, and the isolation region 210, and fills the space between the via plugs 290, and signal transfer lines 300 formed on the interlayer dielectric layer 280.

The gate pattern 245 comprises a gate-insulating layer 220, a gate electrode 230, and an L-type spacer 240. The gate pattern 245 further comprises the gate silicide region 260b.

The via plugs 290 comprise liners 295 at the interface between the via plugs 290 and the interlayer dielectric layer 280.

The source/drain silicide regions 260a can have the same height as the surface of the substrate 205.

The gate silicide region 260b can protrude to expose the side of the gate pattern 245. That is, the source/drain silicide regions 260a can be formed not lower than the surface of the substrate 205, and the gate silicide region 260b can be formed higher than the top of the L-type spacer 240.

Source/drain regions 215 can be formed of impurities implanted at one side of the source/drain silicide regions 260a and inside of the substrate 205 under the L-type spacers 240.

A halo ion implantation region 217 can be formed on the one side of the source/drain regions 215 and the inside of the substrate 205 under the L-type spacer 240 or the gate-insulating layer 220.

For example, a silicon substrate, a silicon-germanium (SiGe) substrate, a compound semiconductor substrate, a SOI (silicon on insulator) substrate, or SOS (silicon on sapphire) substrate can be used as the substrate 205. In case of a silicon germanium substrate, the substrate can be formed by a germanium implantation or a chemical combinational growth of germanium on an activation area between the isolation areas 210, and near the surface of the silicon substrate. Alternatively, only the source/drain region 215 can be a SiGe region. If only the source/drain region 215 is the SiGe region, the SiGe region can be formed after the gate pattern 245 is formed. The SiGe region has a small distance between atoms, so the channel characteristics can be stabilized.

The isolation regions 210, for example, can be shallow trench isolation (STI) regions. The forming method of the isolation region 210 is well known, and the size and the shape of the isolation regions 210 is adjustable according to the semiconductor device, so it is not be described in detail.

The source/drain regions 215 are formed on the substrate, which the L-type spacer 240 is extended to the surface of. One side of the source/drain region 215 can be formed by aligning the part of the L-type spacer 210 formed on the side of the gate pattern 245. In an exemplary embodiment of the present invention, the source/drain region 215 can include the source/drain silicide region 260a. That is, after the source/drain region 215 is formed, part of the source/drain region 215 can become a silicide, thereby forming the source/drain silicide region 260a. Therefore, the source/drain region 215 can be extended or formed under the source/drain silicide region 260a. It is not illustrated in this drawing in order to avoid complicating the drawing.

The halo ion implantation region 217 can be adjacent to one side of the source/drain region, and formed under the vertex of the L-type spacer 240. The halo ion implantation region 217 is the region in which opposite polarity ions of the source/drain region 215 are implanted.

The gate-insulating layer 220 of the gate pattern 245 insulates the substrate 205 from the gate electrode 230. For example, the gate-insulating layer can be silicon oxide, an insulating silicon compound such as silicon nitride or silicon oxynitride, an insulating compound including aluminum oxide, aluminum oxynitride, or hafnium oxide, or any other inorganic insulating material. In an exemplary embodiment of the present invention, silicon oxide is used.

The gate electrode 230 of the gate pattern 245 is separated form the substrate 205 by the gate-insulating layer 220. The gate electrode 230 can be a conductive material such as silicon, conductive compound, metal, or metal silicide. The gate electrode 230 can be a multilayered structure. For example, the gate electrode 230 can be formed of two layers by stacking a silicon layer and a silicide layer, or three or the more layers formed by stacking a metal layer on the two layers. In an exemplary embodiment of the present invention, the gate electrode 230 is a single layer in order to aid understanding the present invention. Therefore, the present invention is not restricted by the single layer, but includes the various multi layers.

The L-type spacer 240 of the gale pattern 245 is formed by wrapping a side of the gate-insulating layer 220 and the gate electrode 230. The L-type spacer 240 is in direct contact with the interlayer dielectric layer 280. The L-type spacer 240 may have a uniform thickness. That is, an insulating layer, which is conventionally known as a "gate spacer" is different from the L-type spacer 240. The conventional "gate spacer" has a thin thickness on the upper side of the gate electrode, that is, a distant region from the surface of the substrate, and has a thick thickness on the lower side of the gate electrode, that is a near region to the surface of the substrate. (See reference number 250 of FIGS. 2D through 2F, below) But, the L-type spacer 240 of this exemplary embodiment has uniform thickness independent of the distance from the upper and lower regions of the gate electrode 230 and the surface of the substrate 205, as illustrated in FIG. 1A.

Also, the L-type spacer 240 can define the source/drain silicide region 260a on the substrate 205. As illustrated in FIG. 1A, the end of the L-type spacer 240 can define the end of the source/drain silicide region 260a. Also, the top of the L-type spacer 240 wrapping the gate electrode 230 can define the bottom of the gate silicide region 260b.

The L-type spacer 240 can be formed of a double layer. For example, two or more silicon oxide, silicon nitride, silicon oxynitride layers can be stacked to form the L-type spacer 240. Specifically, the L-type spacer 240 can be formed of silicon oxide directly on the gate pattern 245, or the L-type spacer 240, which is not directly in contact with the gate pattern 245, can be formed of silicon nitride. Also, the L-type spacer 240 can be formed by stacking same material. For example, it can be formed by stacking multiple layers of nitride having different formation combinations. Specifically, various oxides can be stacked such as an oxide formed by low temperature oxidation, high temperature oxidation, plasma method, and others.

The source/drain silicide regions 260a can be formed in the substrate 205. In an exemplary embodiment of the present invention, the source/drain silicide regions 260a are formed of nickel silicide, and the surface heights of the source/drain silicide regions 260a are same as the surface height of the substrate 205. In other words, the surface height of the source/drain silicide regions 260a is not lower than the surface height of the substrate 205. According to these exemplary embodiments of the present invention, because the source/drain silicide regions 260a are not attacked physically or chemically with a gate spacer removing process, the surface height of the source/drain regions 260a cannot be formed lower than the surface height of the substrate 205. Also, the source/drain silicide regions 260a can be formed at a depth of the order of 100 Å in the direction of the inside of the substrate 205. For example, the depth of the source/drain regions 260a can be about 200 Å to about 500 Å.

The gate silicide region 260b can be formed on the gate electrode 230, and the lowermost part of the gate silicide region 260b is not higher than the top of the L-type spacer 240. The gate silicide region 260b can be formed of nickel silicide. The source/drain silicide regions 260a and the gate silicide region 260b can be formed by electroless plating. A detailed description of electroless plating will be provided in the method of manufacturing the semiconductor device according to various exemplary embodiments of the present invention.

An etch stopper (not shown) can be formed on the L-type spacer 240. The etch stopper can stop an etch process on the surface of the silicide regions 260a, 260b while a via hole is formed in a following process. For example, the etch stopper can be formed of silicon nitride. The etch stopper is not illustrated in FIG. 1A in order to aid understanding the present invention.

The interlayer dielectric layer 280 can be formed of silicon oxide. For example, silicon oxide formed by high density plasma method can be used. The quality of the silicon oxide formed by high density plasma method is excellent and solid, and its filling quality is good, so the conformal interlayer dielectric layer 280 can be formed. Also, the interlayer dielectric layer 280 can be formed of a multilayered structure. Same series materials such as silicon oxide formed by different forming methods can be used. Various characteristics can be made to differ by the different forming methods in spite of the same series material. For example, a silicon oxide layer having a good filling characteristic can be formed at the lower region, and a silicon oxide layer having an excellent dielectric characteristic can be formed at the upper region. Alternatively, a silicon oxide layer having an excellent dielectric characteristic can be formed in the lower region, and a solid silicon oxide layer can be formed in the upper region. For example, a TEOS layer can be formed at the lower region, and a HDP oxide layer can be formed at the upper region.

The liners 295 prevent via plugs 290 from having direct contact with the interlayer dielectric layer 280, and can improve adhesion. If via plugs 290 contact with the interlayer dielectric layer 280 directly, impurities or various ions can migrate. That is, diffusion can occur. The liners 295 can prevent the diffusion. Also, if the adhesion between the via plugs 290 and the interlayer dielectric layer 280 is not good, the liners 295 can improve the adhesion. For example, the liners 295 can be formed of Ti/TiN less than about 200 Å thick in an exemplary embodiment, but other embodiments of the invention are not restricted thereto. Also, inorganic material or dielectric material such as silicon nitride can be used as the liners 295. As illustrated in FIG. 1A, the liners 295 can be formed between the via plugs 290 and the interlayer dielectric layer 280, and between the via plugs and the silicide regions 260a, 260b.

The signal transfer lines 300 can be formed of metal such as tungsten or aluminum. Each of the signal transfer lines 300 can be electrically connected with the via plug 290. Also, a material layer similar to the liners 295 can be formed exterior to the signal transfer lines 300. That is, the material layer can be formed which prevents atoms from migrating and which improves adhesion between the signal transfer line 300 and another layer.

Figure 1B:
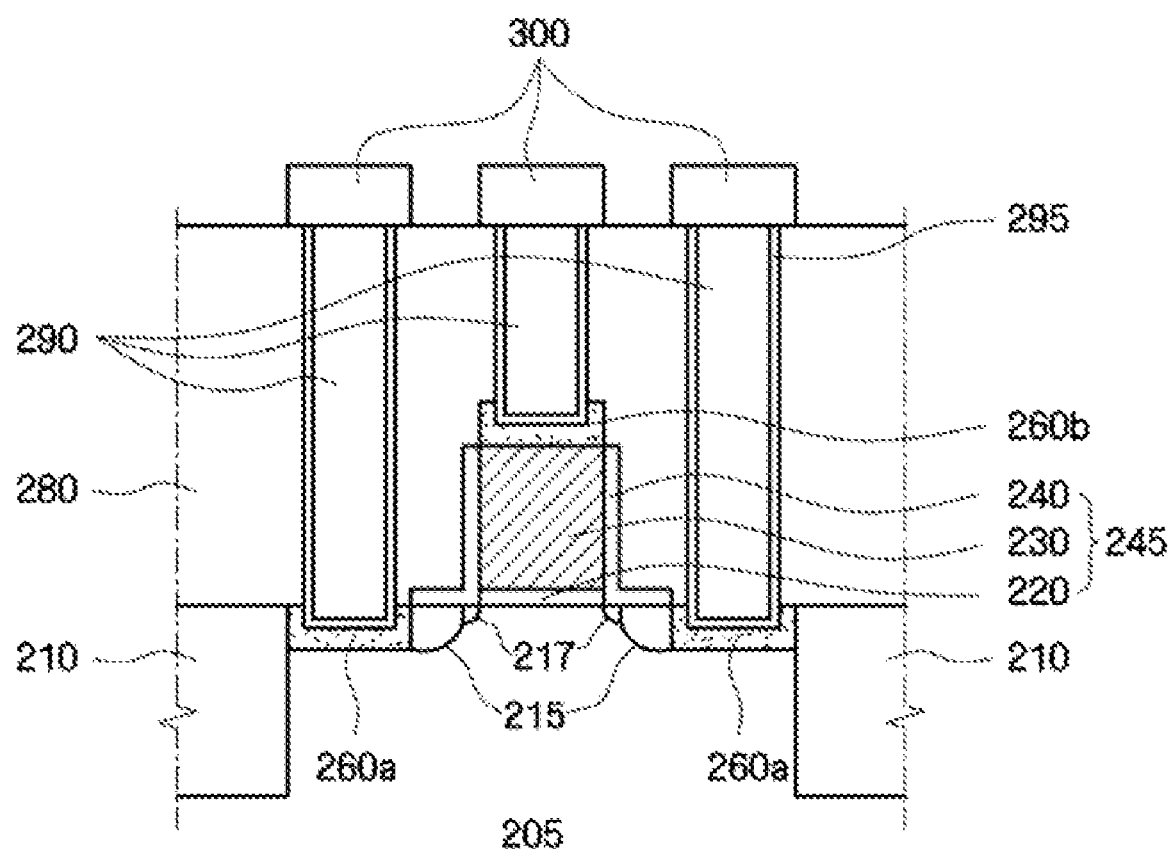

Referring to FIG. 1B, a semiconductor device according to another exemplary embodiment of the present invention includes via plugs 290 extending under a lower region of a surface of silicide regions 260a, 260b to electrically connect to silicide regions 260a, 260b, as compared with the exemplary embodiment of the present invention illustrated in FIG. 1A. In other words, a part of the silicide regions 260a, 260b are recessed, and the recessed surface of the silicide regions 260a, 260b contact the via plugs 290. Therefore, contact size can be increased. When the silicide regions 260a, 260b are recessed and in contact with the via plugs 290, not only the bottom of the via plugs 290, but also the part of the side of the via plugs 290 can contact the silicide regions 260a, 260b. That is, the contact resistance between the via plugs 290 and the silicide regions 260a, 260b can be decreased. Also, liners 295 can be formed between the via plugs 290 and the silicide regions 260a, 260b. The height of the silicide regions 260a, 260b surface, exempting the contact of the via plugs 290 and the silicide regions 260a and 260b, is maintained.

Figure 1C:
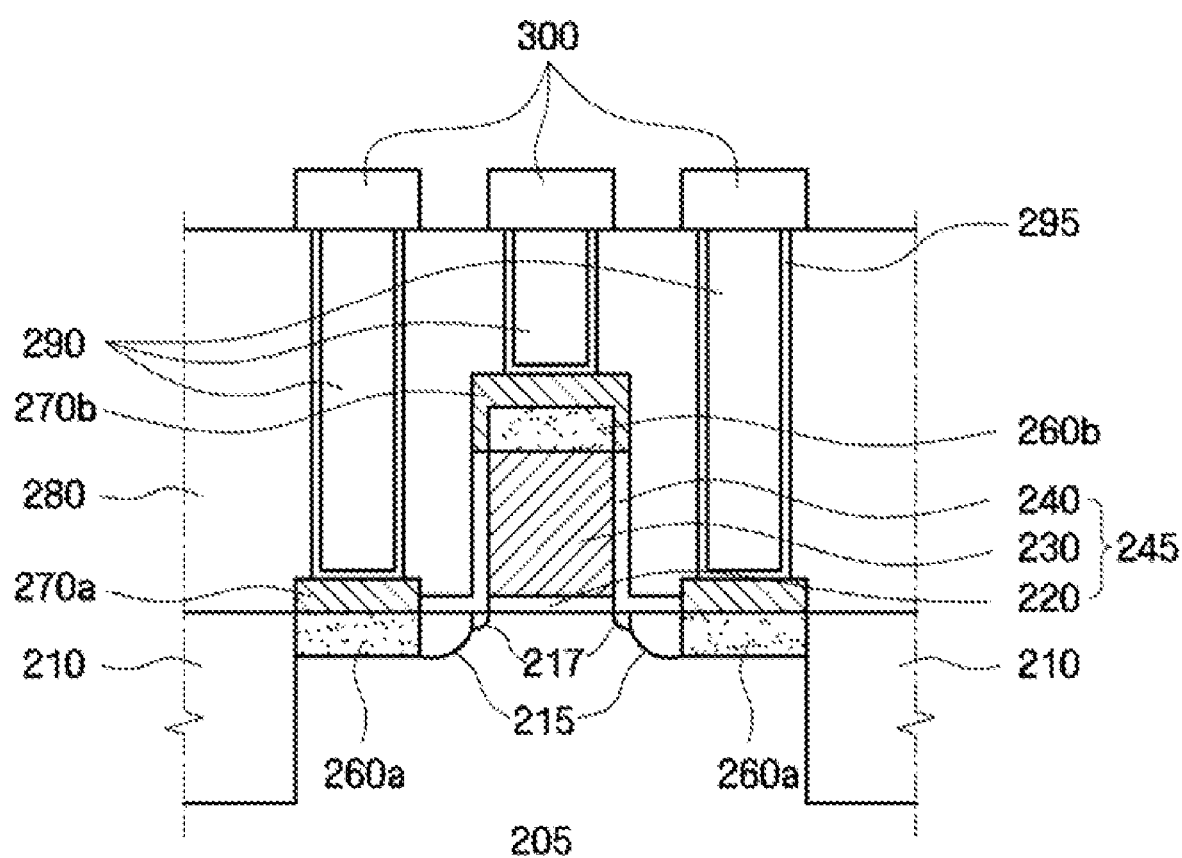

Referring to FIG. 1C, a semiconductor device according to another exemplary embodiment of the present invention includes via plugs 290 electrically connected an elevated pad metal layers 270a, 270b on a silicide regions 260a, 260b as compared with the exemplary embodiment of the present invention illustrated in FIG. 1A. The elevated pad metal layers 270a, 270b on the silicide regions 260a, 260b can be referred to as a sacrificial metal layer. The pad metal layers 270a, 270b on the silicide regions 260a, 260b can decrease the vertical length of the via plugs 290, therefore an aspect ratio of a via hole or the via plugs 290 can be decreased. Therefore, the pattern of the semiconductor device can be easily formed. If the pad metal layers 270a, 270b are formed, the vertical length of the via plugs 290 is decreased. It has the same effect as enlargement of the cross section of the via plugs 290. That is, the resistance of the via plugs 290 decreases. Therefore, the characteristics of the semiconductor device can be improved.

The pad metal layers 270a, 270b include a source/drain pad metal layers 270a and the gate pad metal layers 270b in an exemplary embodiment. But, the source/drain pad metal layers 270a and the gate pad metal layers 270b are formed independently each other. For example, the source/drain pad metal layers 270a can be formed, but the gate pad metal layer 270b cannot be formed. Because the surface of the source/drain silicide regions 260a can affect the semiconductor device more than the gate silicide region 260b, the gate pad metal layer 270b cannot be formed on the gate silicide region 260b. The pad metal layers 270a, 270b can be formed of metals including but not limited to Pt, Pd, Ti, Ta, V, Ir, Ru, W, Co, Ni, Al, or a metal compound with a thickness in the range of about 200 Å to about 500 Å.

Figure 1D:
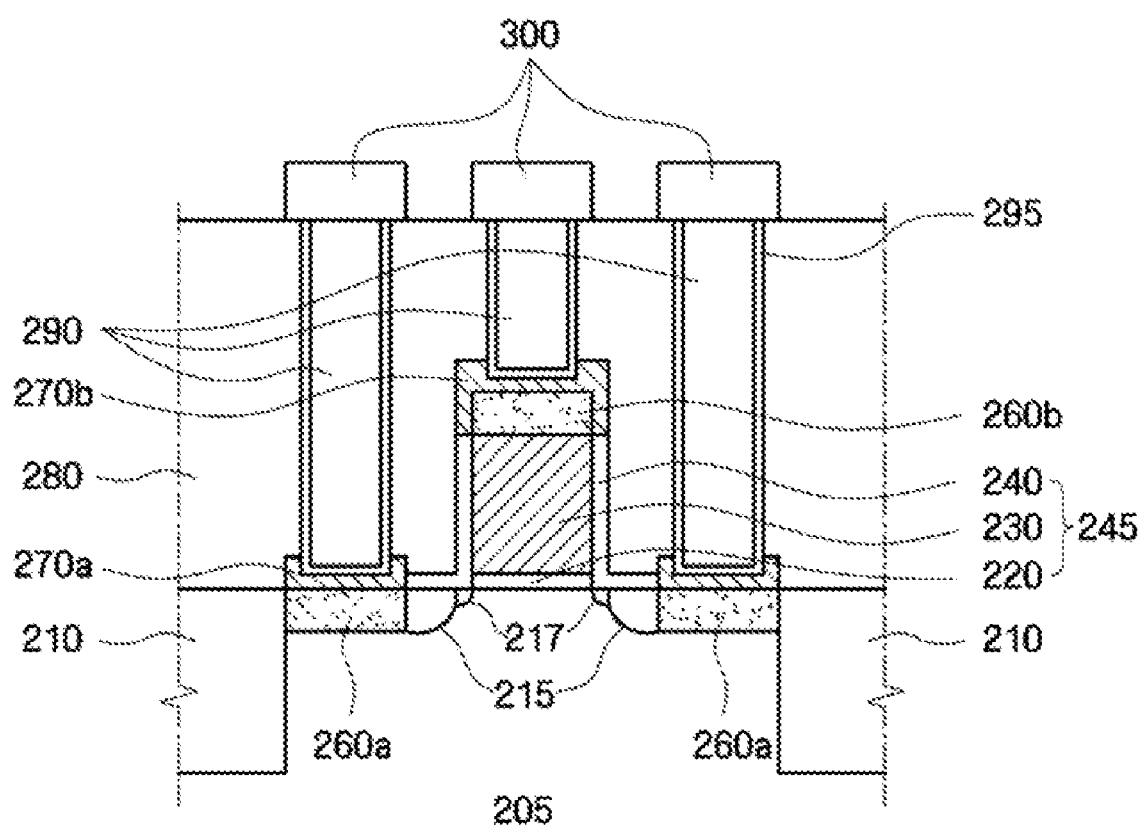

Referring to FIG. 1D, a semiconductor device according to another exemplary embodiment of the present invention includes via plugs 290 formed on a recessed surface of an elevated pad metal layer 270 and electrically connected with the silicide regions 260a, 260b. Because a contact size of the via plugs 290 and the pad metal layers 270a, 270b elevated on the silicide regions 260a, 260b can be increased, the contact resistance between the via plugs 290 and the silicide regions 260a, 260b can be decreased. Liners 295 can be formed between the via plugs 290 and the pad metal layers 270a and 270b.

Figure 1E:
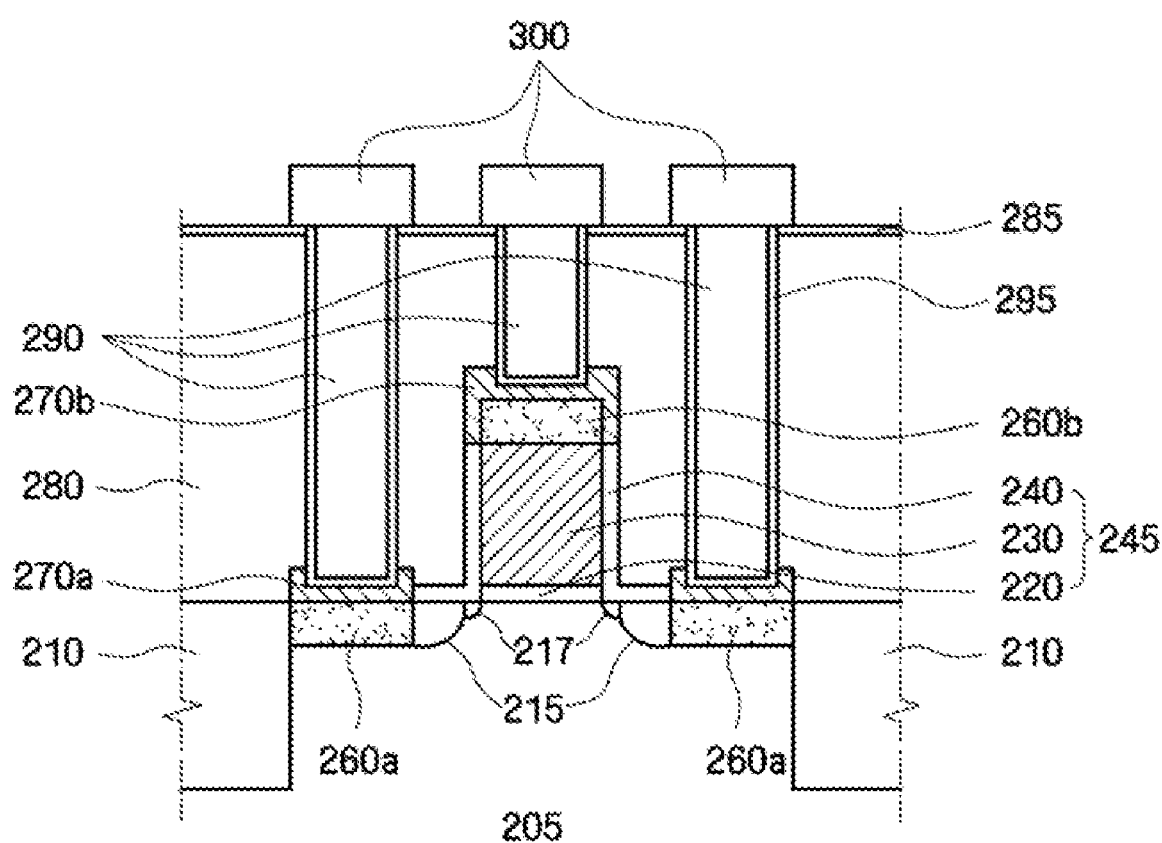

Referring to FIG. 1E, a semiconductor device according to another exemplary embodiment of the present invention includes an upper interlayer dielectric layer 285 having a greater hardness than an interlayer dielectric layer 280 between the interlayer dielectric layer 280 and a signal transfer line 300. If the interlayer dielectric layer 280 is silicon oxide, the upper interlayer dielectric layer 285 having a greater hardness than silicon oxide, such as silicon nitride or silicon oxynitride, can be formed on the interlayer dielectric layer 280. The upper interlayer dielectric layer 285 can fix interlayer dielectric layer 280, can perform as an etch stop layer or chemical mechanical polishing (CMP) etch stopper in a subsequent process, and can perform as a barrier layer which prevents the migration of impurities between the each layer. In an exemplary embodiment, via holes 290 can be formed on the interlayer dielectric layer 280 by dry etching after a pattern mask (not shown) is applied to form via plugs 290. The upper interlayer dielectric layer 285, for example, can be formed of silicon nitride, silicon oxynitride, silicon oxide formed by another method with the interlayer dielectric layer 280 in a shape of a single layer or multi-layered structure. For example, the upper interlayer dielectric layer 285 can be formed of double layer of silicon oxide and silicon oxynitride or another combination. Also, the upper interlayer dielectric layer 285 can be formed between the interlayer dielectric layer 280 and a signal transfer line 300.

The semiconductor device illustrated in FIG. 1E includes the exemplary embodiment illustrated in FIG. 1D. The various exemplary embodiments of the present invention are not exclusive, but can be combined each other. That is, an exemplary embodiment can be freely selected and combined to perform this invention.

Exemplary embodiments of the present invention include only the L-type spacer 240 on the sidewall of the gate pattern 245 as a gate spacer, and the conventional gate spacer is excluded.

Figure 2A:
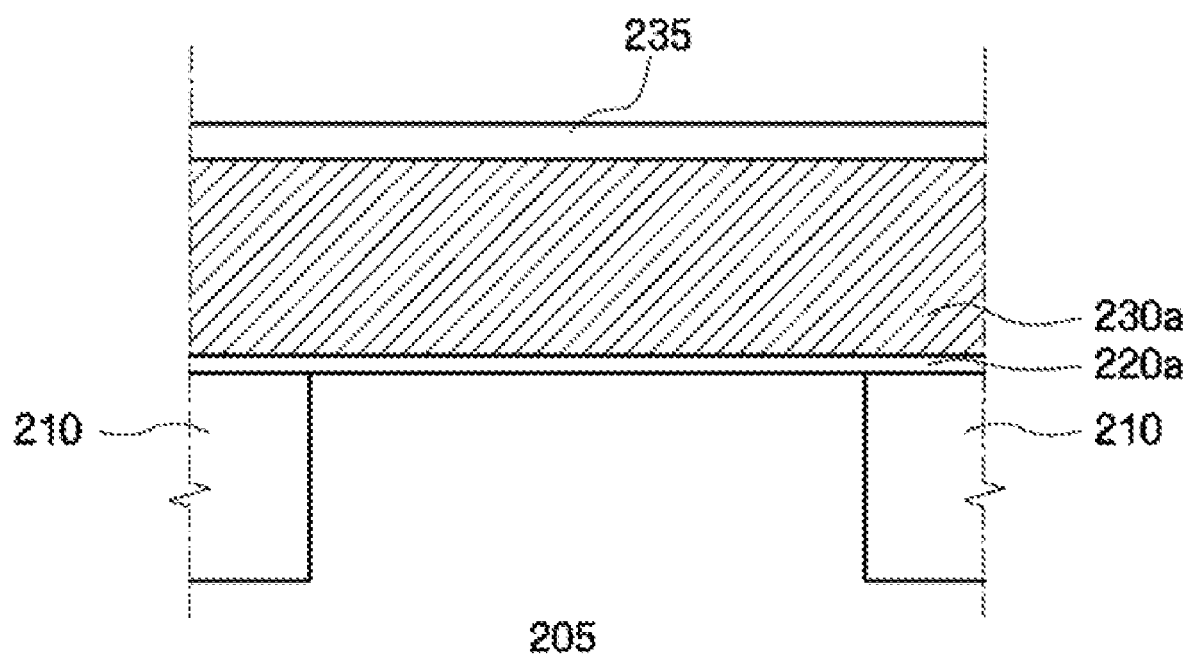
FIG. 2A through 2K are vertical views illustrating a method of manufacturing a semiconductor device according to an exemplary embodiments of the present invention.
Figure 2B:
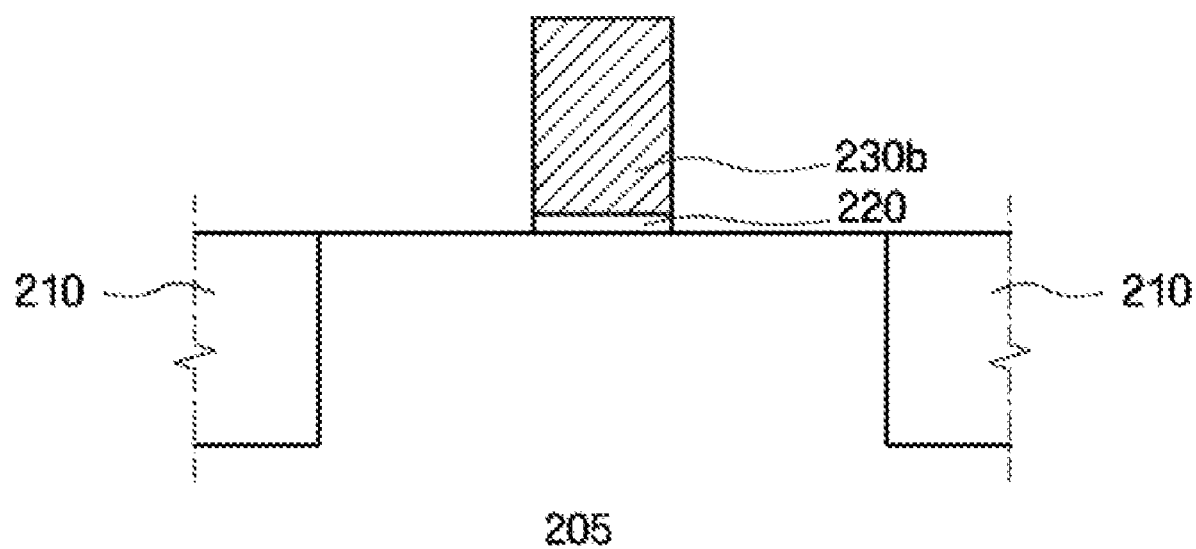
Figure 2C:
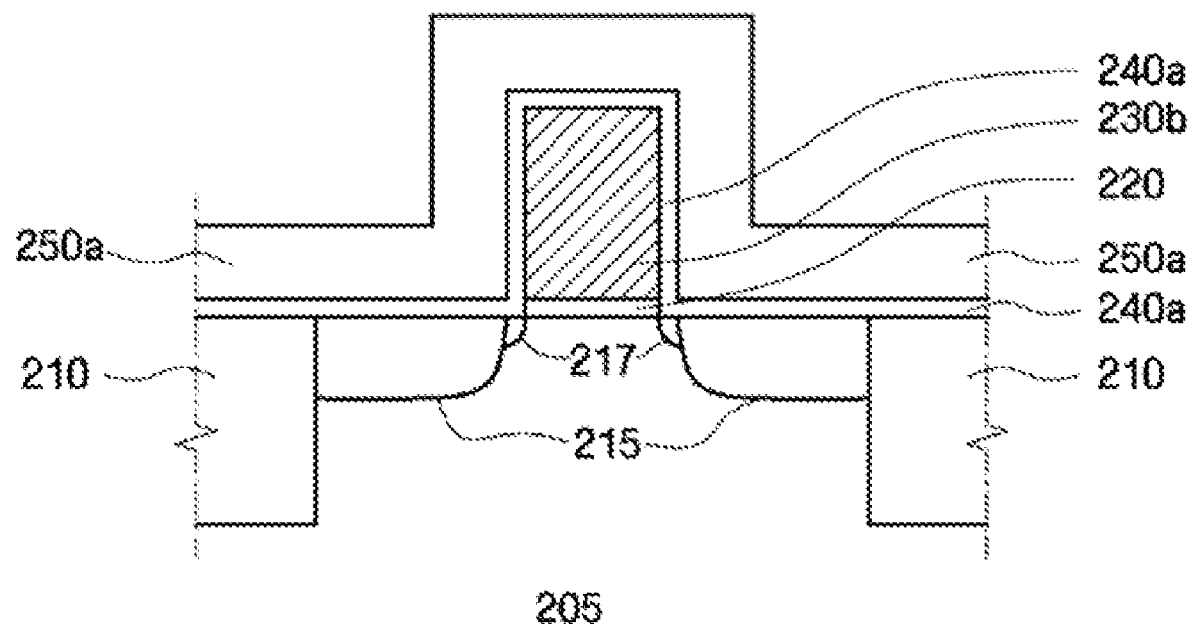
Figure 2D:
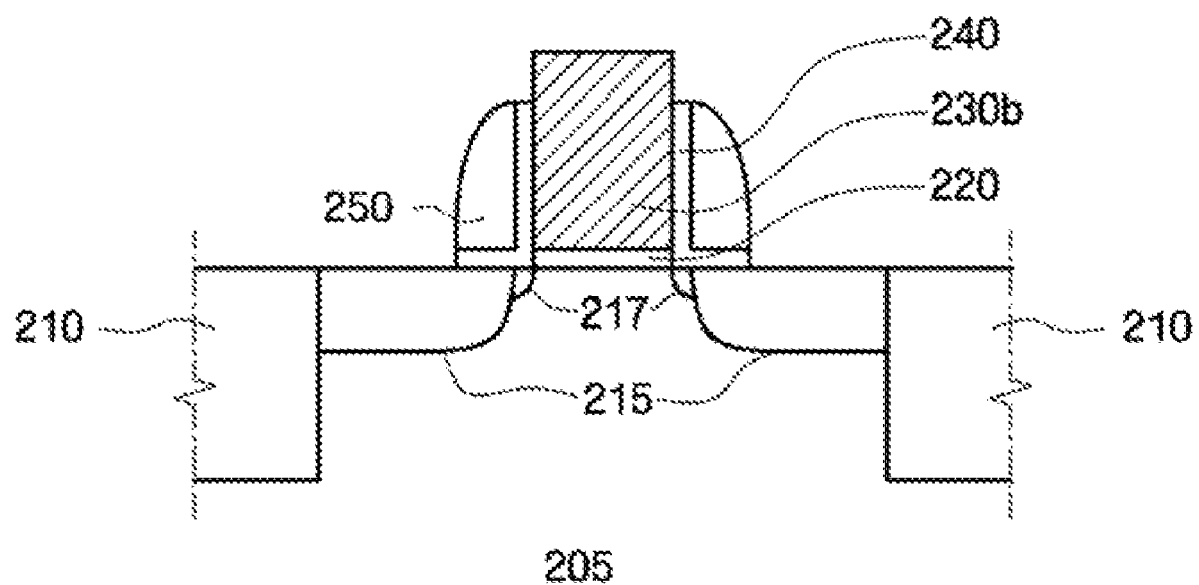
Figure 2E:
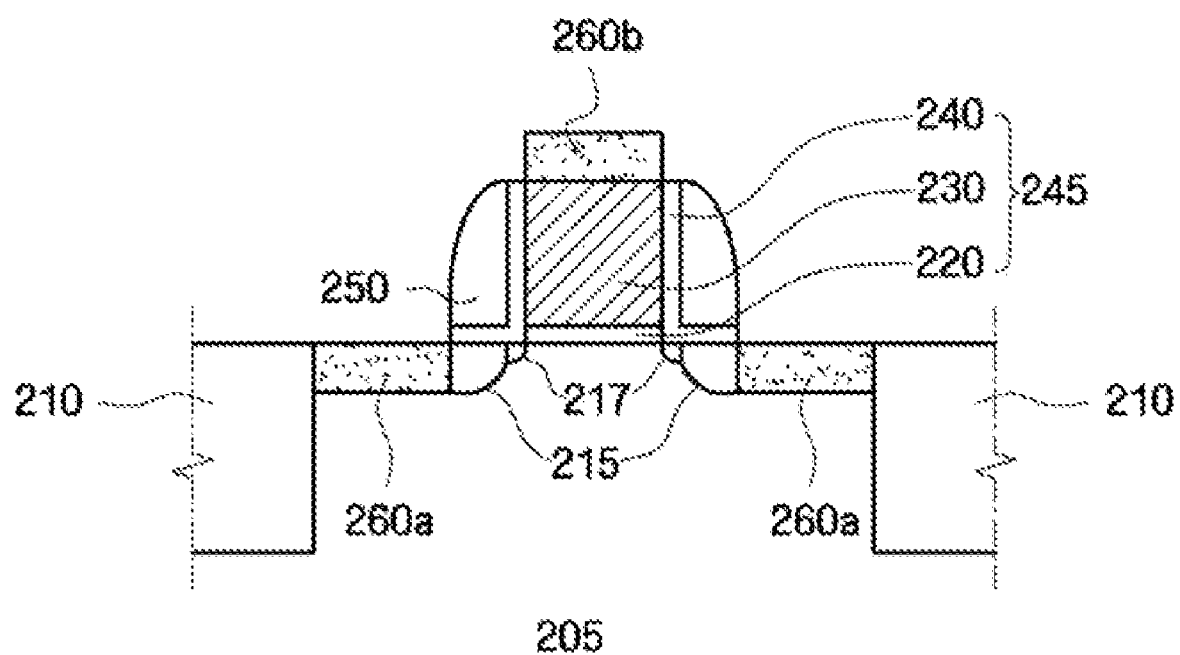
Figure 2F:
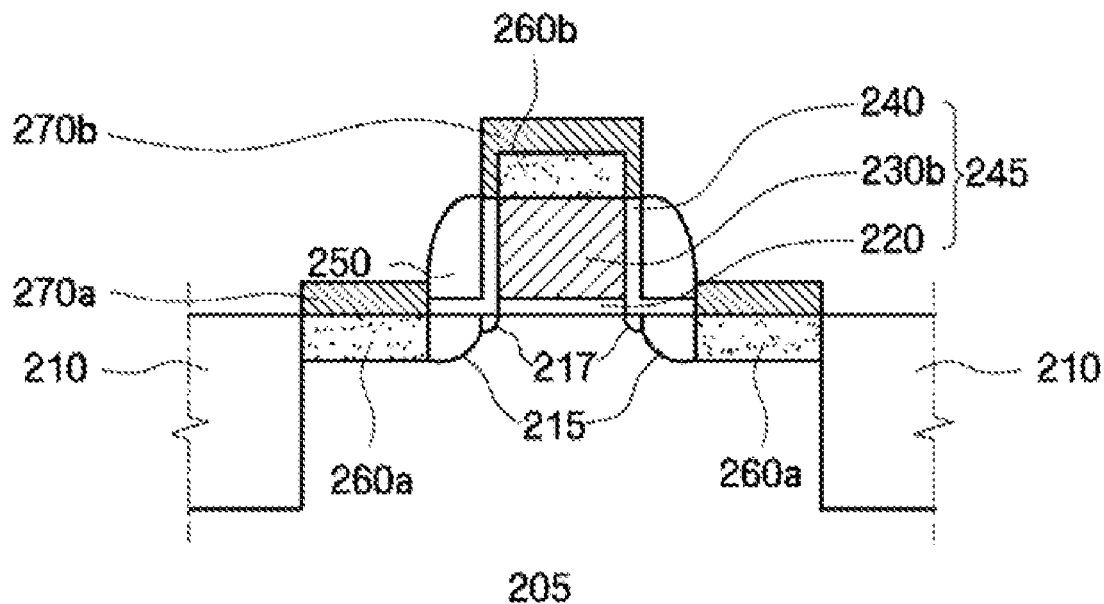

A conventional gate spacer typically includes a gate spacer formed on the side wall of the gate pattern 245, a thin vertical dielectric pattern on the upper, more distant region of the gate electrode 230, and a thick pattern on the lower, nearer region of the gate electrode 230 (see reference number 250 of FIGS. 2D through 2F). In general, the gate spacer is formed with a dense dielectric material in order to have a high selectivity to a surrounding dielectric such as the gate-insulating layer 220 or the L-type spacer 240. The gate spacer can be formed of silicon nitride or silicon oxynitride. The dense dielectric gate spacer creates a tensile stress or compressive stress due to the heat generated during manufacturing or operations. The stress physically affects on the source/drain region 215, the silicide regions 260a, 260b, or channel regions, therefore the performance of the semiconductor device deteriorates and the reliability of the semiconductor device decreases.

Therefore, semiconductor devices having no gate spacer, according to the various exemplary embodiment of the present invention, do not deteriorate and can maintain high reliability during manufacturing and operations.

Also, because semiconductor devices according to various exemplary embodiments of the present invention include the source/drain silicide regions 260a not lower than the surface of the substrate 205, the channel characteristic is not impaired. That is, the operation of the transistor is excellent. If exemplary embodiments of the present invention are not applied, the source/drain silicide regions 260a can be physically and chemically damaged.

In an exemplary embodiment of the present invention, forming nickel silicide provides superior planarization characteristics as well as superior semiconductor characteristics since it can make the surface height of the source/drain silicide regions 260a the same as the surface height of the substrate 205, which in turn provides favorable conditions when a semiconductor device is manufactured. The method of forming nickel silicide will be described later.

Hereinafter, a method of manufacturing a semiconductor device according to an exemplary embodiment of the present invention will be described with reference to FIGS. 2A through 2K. FIG. 2A through 2K are vertical views illustrating a method of manufacturing device according to exemplary embodiment of the present invention.

Referring to FIG. 2A, isolation regions 210 are formed in a substrate 205, and a gate-insulating layer 220a, a gate electrode layer 230a, and a gate mask layer 235 are formed on a whole surface of a substrate 205.

For example, a silicon substrate, a silicon-germanium (SiGe) substrate, a compound semiconductor substrate, a silicon-on-insulator (SOI) substrate, or silicon-on-sapphire (SOS) substrate can be used as the substrate 205. The silicon-germanium substrate can be formed by implanting germanium or growing silicon germanium in an active region between the isolation regions 210 near the surface of a silicon substrate. Alternatively, only a source/drain region can be a silicon germanium substrate. If only the source/drain region is the silicon germanium substrate, the silicon germanium substrate can be formed after a gate pattern is formed.

The isolation regions 210, for example, can be formed by a shallow trench isolation (STI) method. The STI method involves, for example, etching the substrate 205 to a depth on the order of 1000 Å to form the surface of the substrate, and filling it with insulating material. The STI forming method is a well known to those in the art, and is not described in detail in the present disclosure.

The gate insulating layer 220a can be silicon oxide, an insulating silicon compound such as silicon nitride or silicon oxynitride, an insulating compound including aluminum oxide, aluminum oxynitride, or hafnium oxide, or any other insulating inorganic material. In an exemplary embodiment of the present invention, silicon oxide is used. The gate insulating layer 220a can be made to a thickness on the order of 10 Å by an oxidation method or an oxide-deposition method.

The gate electrode layer 230a can be made with a conductive material such as silicon, a conductive compound, metal, or metal silicide. In an exemplary embodiment of the present invention, the gate electrode layer 230a is a single layer in order to aid understanding and to avoid complicated description. Also, the gate conductive layer 230a can be formed by stacking two or more material layers. For example, a metal-silicide compound layer using metal such as tungsten on silicon can be formed. The metal-silicide layer can be formed by heat treatment after a metal layer is formed on a silicon layer. Also, the gate electrode layer 230a can be a three layered structure by having an additional metal layer on top of a metal-silicide layer or can be a structure having more than three layers. In order to avoid complicated drawings and description, the formation of only a single gate electrode layer 230a is illustrated and described, but it is understood that the gate electrode layer 230a includes not only a single layered structure, but also a multi-layered structure. The gate electrode layer 230a can be formed to a thickness on the order of 1000 Å, for example, in the range of 3000 Å to 5000 Å.

The gate electrode layer 230a can be formed by deposition method, and additional heat treatment and ion implantation can be performed after the deposition. For example, the layer can be heated in the order of 100° C. to stabilize a crystal status of the gate electrode layer 230a, and ion implanted with group III or group V, such as boron (B), phosphorous (P), or arsenic (As).

The gate mask layer 235 can be used as an etch mask when the gate electrode layer 230a is patterned. In an exemplary embodiment, the gate mask layer 235 is silicon nitride, but another material layer can be used as the gate mask layer 235 such as silicon oxynitride. The gate mask layer 235 can be formed by deposition method. For example, the thickness of the gate mask layer 235 is about 1000 Å to about 2000 Å in an exemplary embodiment.

Also, an anti-reflective layer (ARL) can be formed on the gate electrode layer 230a or the gate mask layer 235 in order to stabilize the following process. The ARL can be formed of organic or inorganic material. The organic material can be formed of high molecular resin, or the inorganic material can be formed of silicon nitride or silicon oxynitride. The ARL can be formed to a thickness in the order of 100 Å. Since the thickness can be verified according to a wavelength of light used in photolithography processes, a detailed description is omitted. The ARL is not illustrated in this drawing in order to avoid complicating the description of the present invention.

Referring to FIG. 2B, a gate electrode 230b and a gate-insulating layer 220 are formed by patterning the gate electrode layer 230a and the gate insulating film 220a. Specifically, a mask pattern (not shown) is formed on the gate electrode layer 230a for patterning, the gate electrode 230b and the gate-insulating layer 220 are formed by etching, and the mask pattern is removed. For example, the mask pattern can be a photoresist pattern. Alternatively, as already described in connection with FIG. 2A, if the gate mask layer 235 is formed, the gate mask layer 235 is patterned, and then the gate electrode 230b and the gate-insulating layer 220 are patterned with the patterned gate mask layer 235 as an etch mask. Also, the patterned gate mask layer 235 can remain on the gate electrode 230b. In this drawing, in order to aid understanding of the present invention, only the gate electrode 230b and the gate-insulating layer 220 remain after patterning.

Referring to FIG. 2C, an L-type spacer layer 240a and a gate spacer layer 250a are formed on the entire surface of the gate electrode 230b and the substrate 205. The L-type spacer layer 240a can be a silicon oxide layer, and formed by deposition method, and the L-type spacer layer 240a can be formed to a thickness on the order of 10 Å. Alternatively, the L-type spacer layer 240a can be a multi-layered structure. In this case, the L-type spacer layer 240a can include at least two layers selected from the group including silicon oxide, silicon nitride, silicon oxynitride, and others. The selected materials need not be different. That is, the L-type spacer layer 240a can be formed by stacking two silicon oxide layers. In addition, methods of forming the same material can be changed. For example, if two or more layers of silicon oxide are stacked, the L-type spacer layer 240a is formed at a low temperature by deposition method, and then the L-type spacer layer 240a is formed at a high temperature by a plasma method. In addition to the previous methods, the L-type spacer can be formed by various other methods.

Before the gate spacer layer 250a is formed, source/drain region 215 of FIG. 1A through 1E can be formed. The source/drain region 215 can be formed by implanting P, As, or B ions after an L-type spacer layer 240a is formed, or while an L-type spacer layer 240a is formed (in the case of the multi-layered structure). The source/drain region 215 naturally aligns the part of the L-type spacer layer 240a formed on the sidewall of the gate electrode 230b. Also, the halo ion implantation region 217 of FIGS. 1A through 1E can be formed with the source/drain region 215. The halo ion implantation region 217 can be formed after or before the source/drain region 215 is formed.

The halo ion implantation region 217 can be formed by implanting opposite polarity ions to ions which are implanted or which will be implanted in the source/drain region 215. Because halo ion implantation is performed while tilting the substrate 205, the halo ion implantation region 217 can be formed under the vertical part of the L-type spacer layer 240a formed on the sidewall of the gate electrode 230b. The halo ion implantation 217 and the source/drain region 215 can be overlapped. If the concentration of the source/drain region 215 is higher than the concentration of the halo ion implantation region 217, it is unlikely that the concentration of the source/drain region 215 will be diluted.

The gate spacer layer 250a is a layer to form a gate spacer on the sidewall of the gate electrode 230 in the subsequent process, and can be formed of silicon nitride by a deposition method to a thickness in the order of 100 Å. Here, before the gate spacer layer 250a is formed, the light doped source/drain region 215 can be formed. Phosphorous (P), Arsenic (As), or both can be implanted as an impurity. This process is generally known as a light doped drain (LDD) (N−) source/drain 215 forming process. Also, an ion implantation region having the opposite polarity to the source/drain region 217 can be formed. For example, boron (B) ions can be implanted. This process is generally known as a halo or pocket-well forming process. This exemplary embodiment is known as a NMOS. The PMOS is the reverse of the NMOS polarity. Specifically, a P-process has a boron (B) implantation at the source/drain region 215, and the halo or pocket well forming process has a phosphorous (P) or arsenic (As) implantation.

Referring to FIG. 2D, a gate spacer 250 and an L-type spacer 240 are formed. Specifically, a first dry etch process is performed on the entire surface to transform a gate spacer layer 250a to the gate spacer 250, a next wet or dry etch process is performed to transform the L-type spacer layer 240a to the L-type spacer 240. The dry etch process to form the gate spacer 250 can be performed with plasma status main etch gas comprising F— or Cl— with plasma status Ar, $O_2$, and others. The dry etch process to form the gate spacer 250 is well known and not described in the present invention. The L-type spacer 240 can be formed by performing either a wet etch process or a dry etch process. In an exemplary embodiment of the present invention, the L-type spacer 240 can be formed by performing a wet etching process with an etchant containing dilute HF. When the wet etch process is used, the surface of the substrate 205 does not receive plasma damage caused by the etch process and the wet etch process can be performed continuously. When the gate spacer 250 is formed, the upper region and the side of upper region of the gate electrode 230b are exposed and the surface of the substrate 205 corresponding to the source/drain region 215 is also exposed.

In this step, before forming the L-type spacer 250, a process to implant impurities in the substrate 205 corresponding to the source/drain region 215 can be formed. Impurities can be implanted with P, As, or B ions, and relatively higher concentrations compared to previous impurities implantation processes, for example more than twice higher concentration, can be applied. Typically, it is known as an N+ or P+ formation process. It is not described in the drawing to aid understanding of the technical concepts of the present invention since it overlaps with the source/drain silicide regions to be formed later. It is also not described in the drawing since it may not be performed. In particular, N+ or P+ regions may not be formed when silicide regions are formed.

Referring to FIG. 2E, silicide regions 260a and 260b are formed on an upper region of the exposed gate electrode 230 and the upper region of the source/drain region 215. In more detail, the silicide regions 260a, 260b are formed by forming a metal layer (not shown) for silicide on the upper region of the exposed gate electrode 230 and the upper region of the source/drain region 215 and performing heat treatment. The metal layer for silicidation can be formed by electroless plating or physical deposition such as sputtering. The silicide regions 260a, 260b can be formed, after the metal layer for silicidation is formed, by applying heat of several hundreds ° C. to induce the combination of the metal layer and silicon atoms for silicidation. In the present exemplary embodiment of the present invention, the metal layer for silicidation is a nickel layer. When nickel is used for forming silicide, the height of silicide regions 260a, 260b can have the same or similar height of the substrate 205 or gate electrode 230 before forming silicide. When the metal layer for silicidation is formed using a physical deposition method, an additional step to remove the metal layer that has not become a silicidation layer can be performed. When the metal layer for silicidation is formed by electroless plating, the metal layer can be selectively formed in the area where silicon is exposed, which includes the upper region of the gate electrode 230 and the surface of the substrate 205 which corresponds to the area of the source/drain. Thus, the process to remove the metal layer for silicidation can be skipped, if silicide regions 260a, 260b are formed by forming the metal layer for silicidation using electroless plating. In an exemplary embodiment of the present invention, the metal layer is formed for silicidation using electroless plating.

The silicide regions 260 can be formed, after the metal layer for silicidation is formed, by forming an additional metal layer for metal alloy (not shown) and applying heat treatment. In particular, the metal layer for silicidation can be formed using nickel. The metal layer for metal alloy can also be formed using electroless plating. The metal layer for metal alloy can be formed after forming the metal layer for silicidation, however, the metal layer for metal alloy can be formed simultaneously with the metal layer for silicidation. For example, in a case where both metal layers are formed at the same time, they can be formed using plating solutions having metal atoms for silicide and metal atoms for metal alloy. In this step, the ratio of the metal layer for silicidation to the metal layer for metal alloy is the same as the ratio of the metal atoms for silicide to the metal atoms for metal alloy in the plating solution. The containment ratio can be set as an atomic percentage (atomic %). When the two metal layers are alloyed, the atoms of each of the metal layers can be put in the plating solution according to the atom ratio of the two metal layers. Note that each of the metal layers is alloyed according to the atom percentage. In an exemplary embodiment of the present invention, the plating solution has an atomic ratio of the metal atom for silicidation to the metal atom for the metal alloy of less than 30 atomic percentages. In other words, the ratio of the metal layer for silicidation to the metal layer for metal alloy can be under 10:3 atomic percentage. Nonetheless, since this is one exemplary embodiment of the present invention, the present invention is not limited to these specific numbers.

Referring to FIG. 2F, sacrificial metal layers 270a, 270b are formed on the surface of the silicide regions 260a, 260b. The sacrificial metal layers 270a, 270b can be selectively formed on the surface of the silicide regions 260a, 260b using electroless plating. In an exemplary embodiment of present invention, the sacrificial metal layers 270a, 270b can be formed using Pt or Pd, but they are not limited to these types of metal since they can be formed using various other types of metal. In the description of FIG. 2E, in the case when the metal layer for alloy is formed, the sacrificial metal layers 270a, 270b can be formed of the same metal that is used to form the metal layer for alloy. In the descriptions of FIG. 2E, if the metal layer for alloy is not formed or removed after it is formed, the sacrificial metal layers 270a, 270b can be formed directly on the silicide regions 260a, 260b. Also, the sacrificial metal layers 270a, 270b can be directly formed on the metal layer for alloy without removing the metal layer for alloy. In other words, the sacrificial metal layers 270a, 270b can be formed regardless of the metal layer for alloy described in FIG. 2E.

The sacrificial metal layers 270a, 270b can be formed using electroless plating to a thickness of approximately 100 Å in an exemplary embodiment, but other embodiments of the present invention are not limited to this thickness. In other exemplary embodiments of the present invention, the sacrificial metal layers 270a, 270b can be used as pad metal layers. In this case, the thickness can be about 500 Å. Also, the sacrificial metal layers 270a, 270b are formed by forming source/drain sacrificial metal layers 270a and the gate sacrificial metal layer 270b independently. For example, there can be a case that the source/drain sacrificial metal layer 270a is formed, whereas the gate sacrificial metal layer 270b is not formed.

Figure 2G:
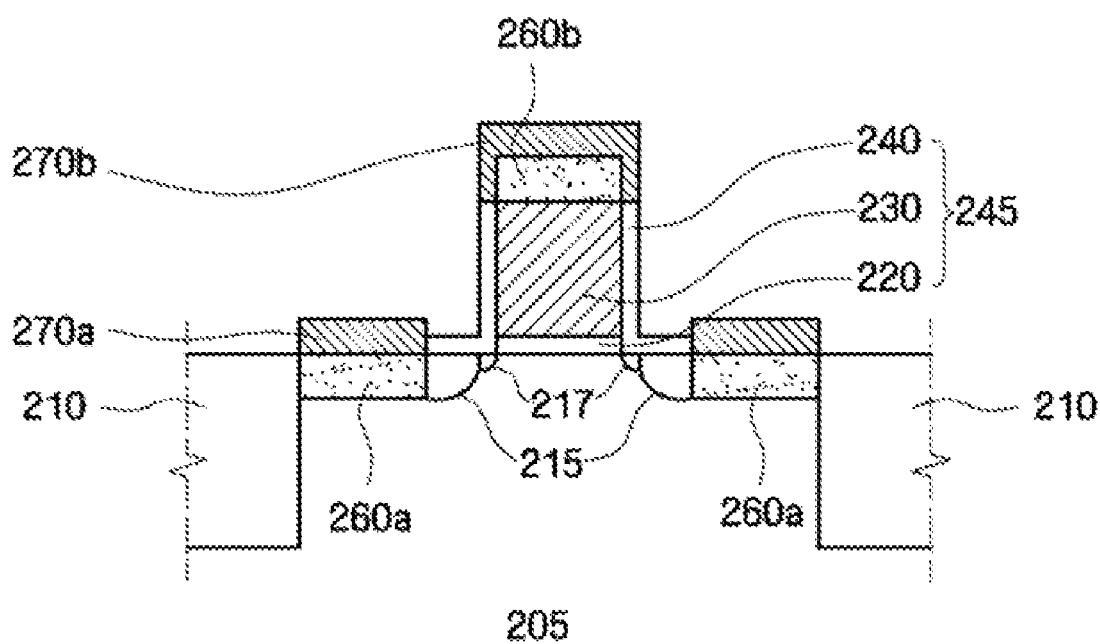

Referring to FIG. 2G, the gate spacer 250 is removed. The gate spacer 250 can be removed using either a dry etch method or a wet etch method. When the gate spacer 250 is removed using a dry etch method, the etchant comprises an F— or Cl— plasma. When the gate spacer 250 is removed using a wet etch method, the gate spacer 250 can be removed using phosphoric acid. If phosphoric acid is used, the gate spacer 250 can be etched using phosphoric acid heated at higher than room temperature, for example, at 40° C. If an additional wet etching process is used, it can be performed with a subsequent cleaning process. If the gate spacer 250 is removed by a wet etch process, because the subsequent cleaning process is a wet process, they can be performed in the same location.

Figure 2H:
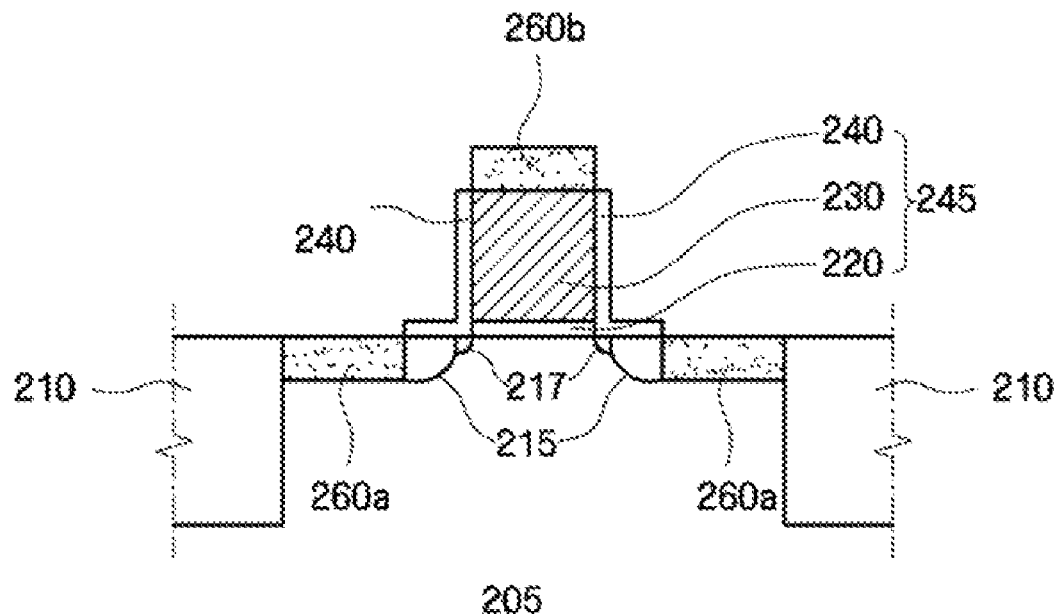

Referring to FIG. 2H, the sacrificial metal layer 270 is removed. The sacrificial metal layer 270 can be removed using, for example, either aqua regia or a mixture of $H_2SO_4$ and $H_2O_2$. Although the metal layer for alloy can be formed under the sacrificial metal layer 270, the sacrificial metal layer 270 is removed. If the metal layer for alloy exists, the metal layer for alloy can be removed with the sacrificial metal layer 270. As a result, the surface of the silicide regions 260a, 260b can be exposed.

Figure 2I:
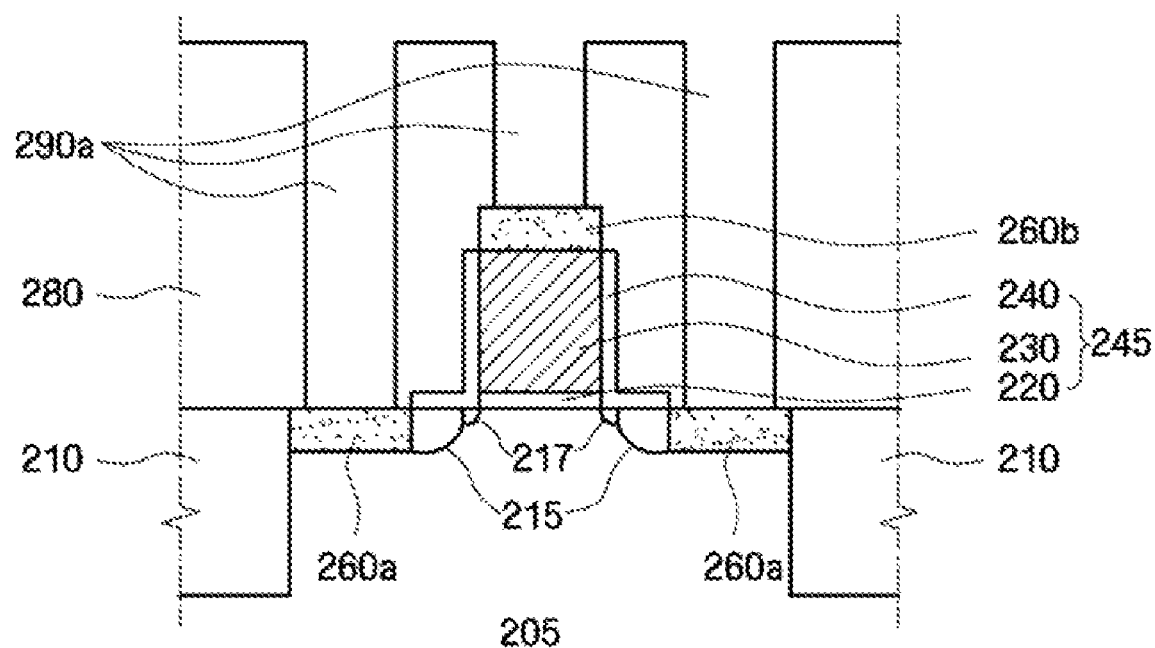

Referring to FIG. 2I, an interlayer dielectric layer 280 is formed. Then via holes 290a are formed by vertically penetrating the interlayer dielectric layer 280 so that the surface of the silicide regions 260 are exposed. For example, the interlayer dielectric layer 280 can be formed of silicon oxide, or the interlayer dielectric layer 280 can be formed using a combination of silicon oxide layers having different physical properties. For example, the interlayer dielectric layer 280 can be formed by sequentially forming a TEOS layer and an HDP oxide layer. However, this is exemplary, and other dielectric layers can be formed as a single layer or as multiple layers.

Additionally, before the via holes 290a are formed, if the interlayer dielectric layer 280 is formed with silicon oxide, a dielectric layer having greater hardness than that of the interlayer dielectric layer 280 (not shown; refer to FIG. 1E) can be additionally formed on the interlayer dielectric layer 280. For example, a dielectric layer having a greater hardness than that of silicon oxide, such as silicon nitride or silicon oxynitride, can be formed on the interlayer dielectric layer 280. The harder dielectric layer can fasten the interlayer dielectric layer 280, can perform the function of van etch stop layer or a CMP (chemical mechanical polishing) stop layer in the subsequent process, and also block movement of interlayer impurities. In an exemplary embodiment of the present invention, the via holes 290a can be formed by performing a dry etch process on top of the interlayer dielectric layer 280 after forming pattern masks (not shown) to form the via holes 290a. The layer having a greater hardness than that of the interlayer dielectric layer 280 corresponds to the upper dielectric layer 285 in the descriptions of FIG. 1E.

Figure 2J:
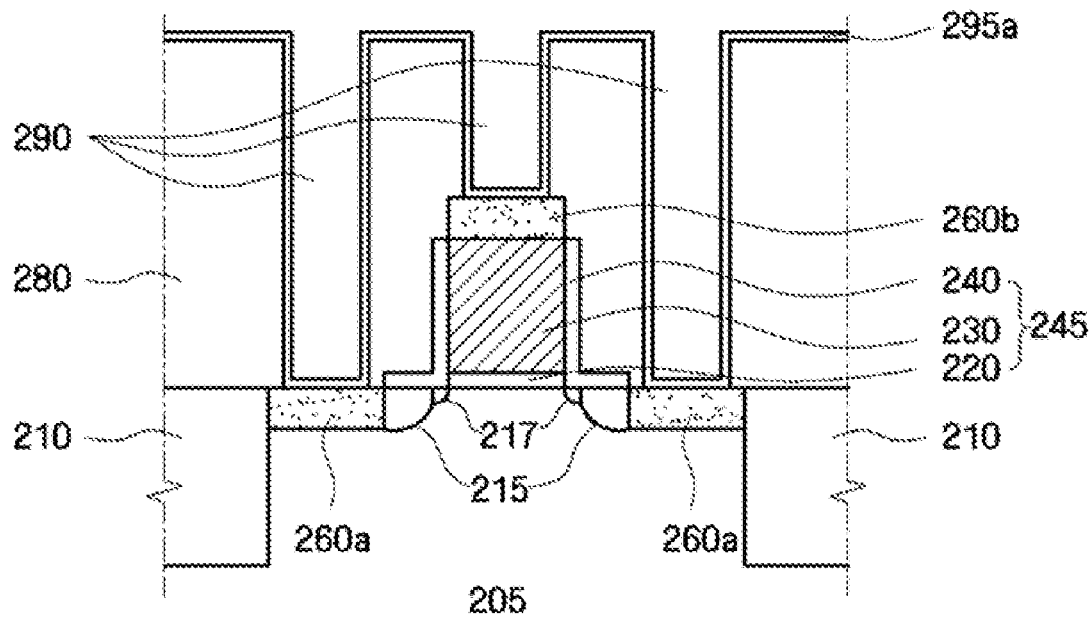

Referring to FIG. 2J, a liner layer 295a is formed on the interior wall of the via holes 290a. The liner layer 295a, for example, can be a metal layer such as Ti/TiN or can be an inorganic dielectric layer such as silicon nitride. If the interlayer dielectric layer 280 is an oxide layer, the liner layer 295a prevents the material formed inside via holes 290a from having a direct contact to the oxide layer. As illustrated in the drawing, the liner layer 295a can be formed on top of the interlayer dielectric layer 280, also it can be formed on the bottom area of the via holes 290a such that it has a direct contact with the silicide regions 260a and 260b.

Figure 2K:
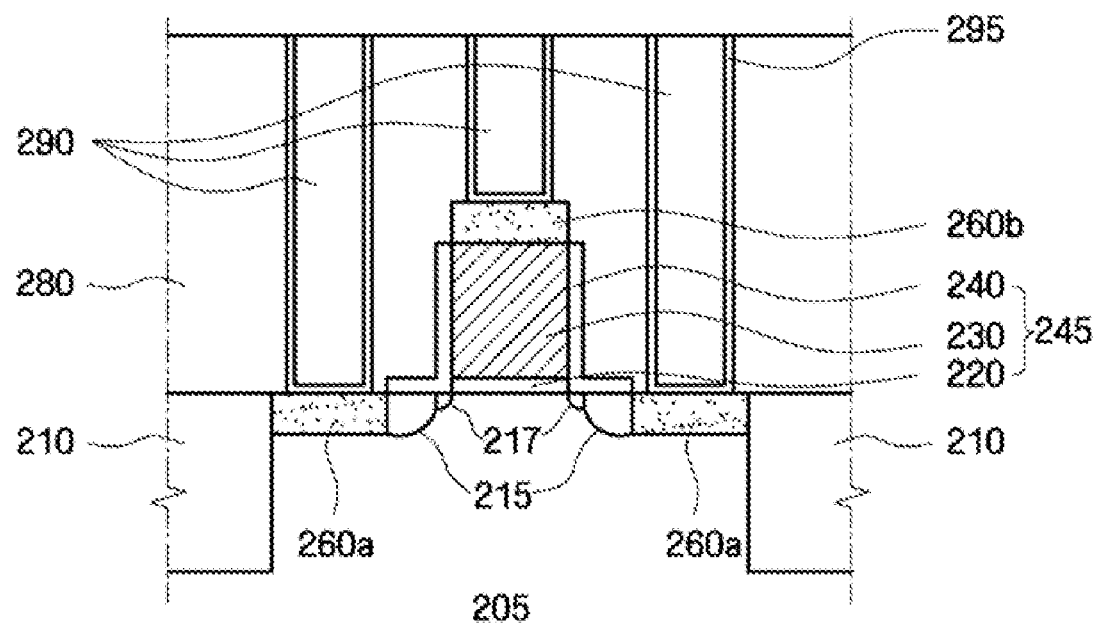

Referring to FIG. 2K, via plugs 290 are formed inside the via holes 290a. Specifically, the via plugs 290 are formed by stuffing conductive materials inside the via holes 290a after a node isolation of the liner layer 295a. In order to perform the node isolation of the liner layer 295a, a material for the node isolation of the liner layer 295a is formed extensively inside the via holes 290a, on the interlayer dielectric layer 280 and on the liner layer 295a, and then a whole surface etch process or a CMP process is performed for node isolation of the liner layer 295a. After node isolation of the liner layer 295a, the material layer is removed and the via plugs 290 are formed by stuffing conductive material inside the via holes 290a. The via plug 290, for example, can be formed using tungsten or other types of metal. In particular, the material to form the via plugs 290 fills the inside of the via holes and can be formed on top of the interlayer dielectric layer 280. The surface of the via plug 290 is processed such that the surface has the same height as the surface height of the interlayer dielectric layer 280.

Then, the semiconductor device shown in FIG. 1A is completed by forming signal-transfer wires 300 that are electrically connected to the via plugs 290. The signal-transfer wires 300 are formed of conductive materials, for example, tungsten, aluminum, or copper. If a method such as dual damascene is used, the via plugs 290 and the signal-transfer wires 300 can be formed simultaneously. The dual damascene method is well known and is not described in detail in the present invention.

While embodiments of the present invention have been particularly shown and described with reference to exemplary embodiments thereof, it will be apparent to those skilled in the art that the scope of the invention is given by the appended claims, rather than the preceding description, and all variations and equivalents which fall within the range of the claims are intended to be embraced therein. Therefore, it should be understood that the above embodiments are not limiting, but illustrative in all aspects. As described above, according to the semiconductor device with free of gate spacer stress and method of manufacturing the same in the exemplary embodiments of the present invention, the source/drain, the gate electrode, the channel region do not get stress caused by the gate spacer, and physical and chemical damages are not introduced in the source/drain region. As a result, the characteristics of the semiconductor device are improved, and productivity and yield can be improved due to the method of manufacturing semiconductor devices provided by the various exemplary embodiments of the present invention.

The invention claimed is:

1. A method of fabricating a semiconductor device, the method comprising:
   forming isolation regions in a substrate;
   forming a gate pattern on the substrate;
   forming an L-type spacer layer which covers an upper region and sidewall of the gate pattern;
   forming a gate spacer layer on the L-type spacer layer;
   forming an L-type spacer on the sidewall of the gate pattern and extended to the substrate and a gate spacer by patterning the L-type spacer layer and the gate spacer layer, and simultaneously exposing a surface of the substrate between the gate spacer and the isolation regions;
   forming a source/drain silicide region on the exposed substrate;
   forming a sacrificial metal layer on the source/drain silicide region;
   removing the gate spacer;
   removing the sacrificial metal layer;
   forming an interlayer dielectric layer which covers the gate pattern and the source/drain silicide region; and
   forming via plugs electrically connected with the source/drain silicide region by vertically penetrating the interlayer dielectric layer.

2. The method of claim 1, wherein the source/drain silicide region is not lower than the surface of the substrate.

3. The method of claim 1, wherein the gate pattern includes
a gate-insulating layer which contacts the surface of the substrate;
a gate electrode formed on the gate-insulating layer; and
a gate silicide region formed on the gate electrode.

4. The method of claim 3, wherein a lower part of the gate silicide region is not higher than an upper region of the L-type spacer.

5. The method of claim 3, further comprising forming a gate sacrificial metal layer on the gate silicide region, and removing the gate sacrificial metal layer.

6. The method of claim 5, wherein the gate sacrificial metal layer is extended to be formed on a sidewall of the gate silicide region.

7. The method of claim 1, wherein the via plugs vertically penetrate the interlayer dielectric layer to form via holes which selectively expose a surface of the source/drain silicide region, and the method further comprises
forming a liner on a sidewall of the via holes and the surface of the source/drain silicide region; and
filling the inside of the via holes with conductive material.

8. The method of claim 7, wherein the surface of the source/drain silicide region is recessed while the via holes are formed.

9. The method of claim 1, wherein the L-type spacer is a multi-layered structure comprising a combination of at least two selected from the group consisting of silicon oxide, silicon nitride, and silicon oxynitride.

10. The method of claim 1, further comprising forming an etch stopper which covers the gate pattern and the source/drain silicide region before forming the interlayer dielectric layer.

11. A method of fabricating a semiconductor device, the method comprising:
forming isolation regions in a substrate;
forming a gate pattern on the substrate;
forming an L-type spacer layer which covers an upper region and sidewall of the gate pattern;
forming a gate spacer layer on the L-type spacer layer;
forming an L-type spacer on the sidewall of the gate pattern and extended to the substrate and a gate spacer by patterning the L-type spacer layer and the gate spacer layer;
and exposing a surface of the substrate corresponding to between the gate spacer and the isolation regions;
forming a source/drain silicide region on the exposed substrate;
forming a source/drain pad metal layer on the source/drain silicide region;
removing the gate spacer;
forming an interlayer dielectric layer which covers the gate pattern and the source/drain silicide region; and
forming via plugs electrically connected with the source/drain silicide region by vertically penetrating the interlayer dielectric layer.

12. The method of claim 11, wherein the source/drain silicide region is not lower than the surface of the substrate.

13. The method of claim 11, wherein the gate pattern includes
a gate-insulating layer which contacts with the surface of the substrate;
a gate electrode formed on the gate-insulating layer; and
a gate silicide region formed on the gate electrode.

14. The method of claim 13, wherein a lower part of the gate silicide region is not higher than a top of the L-type spacer.

15. The method of claim 14, further comprising forming a gale pad metal layer on the gate silicide region.

16. The method of claim 15, wherein the gate pad metal layer is extended to be formed on the sidewall of the gate silicide region.

17. The method of claim 11, wherein the via plugs vertically penetrate the interlayer dielectric layer to form via holes which selectively expose a surface of the source/drain silicide region, and the method further comprises
forming a liner on a sidewall of the via holes and the surface of the source/drain silicide region; and
filling the inside of the via holes with conductive material.

18. The method of claim 17, wherein the surface of the source/drain silicide region is recessed while the via holes are formed.

19. The method of claim 11, wherein the L-type spacer is a multi-layered structure comprising a combination of at least two selected from the group consisting of silicon oxide, silicon nitride, and silicon oxynitride.

20. The method of claim 11, further comprising forming an etch stopper which covers the gate pattern and the source/drain silicide region before forming the interlayer dielectric layer.

* * * * *